United States Patent
Loopstra et al.

(10) Patent No.: US 8,278,636 B2
(45) Date of Patent: Oct. 2, 2012

(54) RADIATION SOURCES AND METHODS OF GENERATING RADIATION

(75) Inventors: Erik Roelof Loopstra, Eindhoven (NL); Hendrikus Gijsbertus Schimmel, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 254 days.

(21) Appl. No.: 12/540,596

(22) Filed: Aug. 13, 2009

(65) Prior Publication Data

US 2010/0039631 A1  Feb. 18, 2010

Related U.S. Application Data

(60) Provisional application No. 61/136,134, filed on Aug. 14, 2008, provisional application No. 61/193,510, filed on Dec. 4, 2008.

(51) Int. Cl.
*G21K 1/00* (2006.01)
(52) U.S. Cl. ............... 250/503.1; 250/492.1; 250/492.2; 250/493.1
(58) Field of Classification Search ............... 250/492.1, 250/492.2, 503.1, 504 R
See application file for complete search history.

(56) References Cited

U.S. PATENT DOCUMENTS

| 2002/0162975 A1* | 11/2002 | Orsini ........................ 250/504 R |
| 2004/0195529 A1 | 10/2004 | Hergenhan et al. |
| 2005/0225739 A1 | 10/2005 | Hiura et al. |
| 2005/0230645 A1* | 10/2005 | Melnychuk et al. ...... 250/504 R |
| 2005/0258768 A1 | 11/2005 | Gaebel et al. |
| 2007/0127007 A1* | 6/2007 | Cormont et al. ............. 355/403 |

FOREIGN PATENT DOCUMENTS

| EP | 1617292 A2 | 1/2006 |
| WO | 2005096680 A1 | 10/2005 |

OTHER PUBLICATIONS

EPO Search Report issued May 26, 2010 in EP Patent Application No. EP 09 16 5403.8.

* cited by examiner

*Primary Examiner* — Michael Maskell
*Assistant Examiner* — Hanway Chang
(74) *Attorney, Agent, or Firm* — Pillsbury Winthrop Shaw Pittman LLP (57) ABSTRACT

A radiation source is configured to generate radiation. The radiation source includes a fuel droplet generator constructed and arranged to generate a stream of droplets of fuel that are directed to a plasma generation site; a laser constructed and arranged to generate a laser beam that is directed to the plasma generation site, an angle between the direction of movement of the stream of droplets and the direction of the laser beam being less than about 90°; and a collector constructed and arranged to collect radiation generated by a plasma formed at the plasma formation site when the beam of radiation and a droplet collide. The collector is configured to reflect the radiation substantially along an optical axis of the radiation source. The laser beam is directed to the plasma generation site through an aperture provided in the collector.

22 Claims, 6 Drawing Sheets

RADIATION SOURCES AND METHODS OF GENERATING RADIATION

CROSS-REFERENCE TO RELATED APPLICATIONS

This application claims the benefit of priority from U.S. Provisional Patent Application Ser. Nos. 61/136,134, filed Aug. 14, 2008, and 61/193,510, filed Dec. 4, 2008, the contents of both of which are incorporated herein by reference in their entireties.

FIELD

The present invention relates to radiation sources and to methods of generating radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

Radiation may be produced using a plasma. The plasma may be created, for example, by directing one or more laser beam pulses at a fuel, such as droplets of a suitable material (e.g. tin), or a stream of a suitable gas or vapour, such as Xe gas or Li vapor. The resulting plasma emits radiation, e.g., EUV radiation, which is collected using a collector such as a mirrored collector, that receives the radiation and focuses the radiation into a beam. The radiation emitting plasma and the collector may together be considered to comprise a radiation source. A radiation source which generates plasma by directing a laser onto fuel droplets, as described above, is often referred to as a laser produced plasma (LPP) source.

SUMMARY

It is desirable to provide, for example, a method and/or apparatus that increases the time taken for a droplet of fuel to pass through a laser beam pulse. Such an increase in time results in an increased time during which a plasma, and therefore radiation, may be generated. Alternatively or additionally, it is desirable to provide, for example, a method and/or apparatus that allows the control of the angle between the direction of movement of a stream of droplets of fuel and a laser beam.

According to a first aspect of the invention, there is provided a radiation source configured to generate radiation, the radiation source comprising: a fuel droplet generator constructed and arranged to generate a stream of droplets of fuel that are directed to a plasma generation site; a laser constructed and arranged to generate a laser beam that is directed to the plasma generation site, an angle between the direction of movement of the stream of droplets and the direction of the laser beam being less than about 90°, and a collector constructed and arranged to collect radiation generated by a plasma formed at the plasma formation site when the beam of radiation and a droplet collide, the collector being configured to reflect the radiation substantially along an optical axis of the radiation source, wherein the laser beam is directed to the plasma generation site through an aperture provided in the collector.

The radiation source may further comprise a controller for controlling the direction of the laser beam and/or the direction of movement of the stream of droplets to control the angle between the laser beam and the stream of droplets. The controller may be configured to control the position or orientation of the fuel droplet generator and/or the laser to control the angle between the direction of the laser beam and the direction of movement of the stream of droplets.

The stream of droplets may be directed such that the stream of droplets has a component of movement along the optical axis of the radiation source which is pointing away from the collector. The laser beam and the stream of droplets may be directed such that the laser beam and the stream of droplets have a component of movement along the optical axis of the radiation source which is pointing away from the collector.

The radiation source may further comprise a catchment arrangement for catching droplets that are not directed toward the plasma generation site.

The laser beam may be directed along the optical axis of the radiation source.

The stream of droplets may be directed in a direction that is not perpendicular to the optical axis of the radiation source.

The laser beam and the stream of droplets may be directed to the plasma generation site through an aperture provided in the collector.

The collector may be a normal incidence collector.

The radiation source may be configured to generate EUV radiation.

According to a second aspect of the invention, there is provided a method of generating radiation, comprising: directing a stream of droplets of fuel to a plasma generation site; directing a laser beam to the plasma generation site, an angle between the direction of movement of the stream of droplets and the direction of the laser beam being less than about 90°, and using a collector to collect radiation generated by a plasma formed at the plasma formation site when the beam of radiation and a droplet collide, and reflecting the radiation substantially along an optical axis of the radiation source, wherein one of the laser beam and the stream of droplets are directed to the plasma generation site through an aperture provided in the collector.

The second aspect of the invention may include, where appropriate, one or more features of the first aspect of the present invention.

According to a third aspect of the invention, there is provided a radiation source configured to generate radiation, the radiation source comprising: a fuel droplet generator constructed and arranged to generate a stream of droplets of fuel that are directed to a plasma generation site; a laser constructed and arranged to generate a laser beam that is directed to the plasma generation site, and a controller for controlling the direction of the laser beam and/or the direction of movement of the stream of droplets to control the angle between the laser beam and the stream of droplets.

The controller may be configured to control the position or orientation of the fuel droplet generator and/or the laser to control the angle between the direction of the laser beam and the direction of movement of the stream of droplets.

The direction of the laser beam and/or the stream of droplets may be controlled to control the time taken for a droplet of the stream of droplets to pass through at least a part of the laser beam. The direction of the laser beam and/or the stream of droplets may be controlled to control a property of radiation generated by the radiation source.

An angle between the stream of droplets and the direction of the laser beam may be less than about 90°.

The third aspect of the invention may include, where appropriate, one or more features of the first or second aspects of the present invention.

According to a fourth aspect of the invention, there is provided a method of generating radiation, the method comprising: directing a stream of droplets of fuel to a plasma generation site; directing a laser beam to the plasma generation site; and controlling the direction of the laser beam and/or the direction of movement of the stream of droplets to control the angle between the laser beam and the stream of droplets.

The fourth aspect of the invention may include, where appropriate, one or more features of the first, second or third aspects of the present invention.

According to a fifth aspect of the invention, there is provided a fuel droplet-laser beam collision time increasing apparatus, that is also arranged to generate radiation, the apparatus comprising: a fuel droplet generator constructed and arranged to generate a stream of droplets of fuel that are directed to a plasma generation site; and a laser constructed and arranged to generate a laser beam that is directed to the plasma generation site, an angle between the direction of movement of the stream of droplets and the direction of the laser beam being less than about 90°.

The fifth aspect of the invention may include, where appropriate, one or more features of the first, second, third or fourth aspects of the present invention.

According to a sixth aspect of the invention, there is provided a method of increasing the collision time between a droplet of fuel and at least a part of a laser beam, the collision resulting in the generation of radiation, the method comprising: directing a stream of droplets of fuel to a plasma generation site; directing a laser beam to the plasma generation site, an angle between the stream of droplets and the direction of the laser beam being less than about 90°.

The sixth aspect of the invention may include, where appropriate, one or more features of the first, second, third, fourth or fifth aspects of the present invention.

According to a seventh aspect of the invention, there is provided a lithographic apparatus comprising: a radiation source according to the first or third aspects of the present invention, or a fuel droplet-laser beam collision time increasing apparatus according to the fifth aspect of the present invention; a support constructed and arranged to support a patterning device, the patterning device being configured to pattern radiation that passes through the intermediate focus; and a projection system constructed and arranged to project the patterned radiation onto a substrate.

The seventh aspect of the invention may include, where appropriate, one or more features of the first, second, third, fourth, fifth or sixth aspects of the present invention.

According to a eighth aspect of the invention, there is provided a device manufacturing method comprising: generating radiation using the method according to the second, fourth or sixth aspects of the present invention; patterning the radiation with a pattering device; and projecting the patterned radiation onto a substrate.

The eighth aspect of the invention may include, where appropriate, one or more features of the first, second, third, fourth, fifth, sixth or seventh aspects of the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
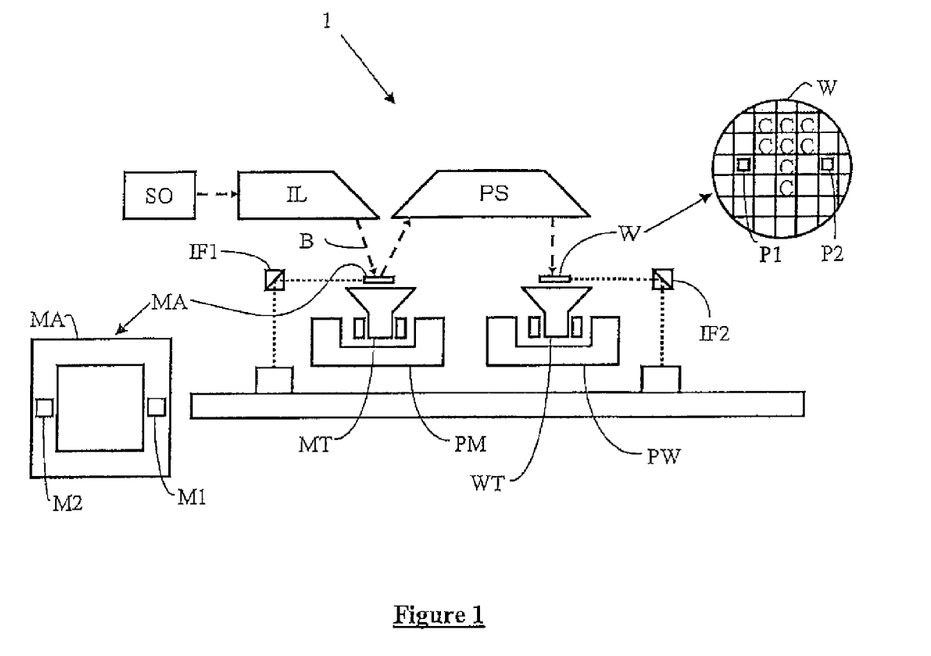
FIG. 1 schematically depicts a lithographic apparatus according to an embodiment of the invention.

FIG. 1 schematically depicts a lithographic apparatus 1 according to one embodiment of the invention. The apparatus comprises an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
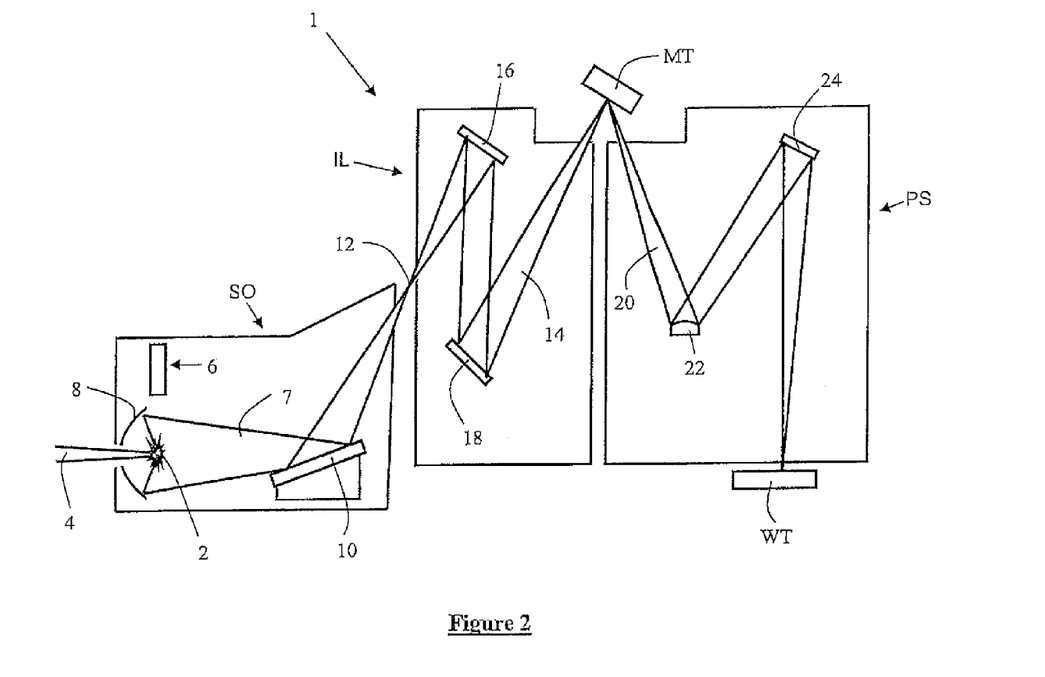
FIG. 2 schematically depicts a more detailed view of the lithographic apparatus of FIG. 1.

FIG. 2 shows the apparatus of FIG. 1 in more detail, including the source SO, the illuminator IL, and the projection system PS. The source SO generates EUV radiation from a plasma 2. The plasma 2 is created by directing a laser beam 4 onto droplets of a suitable material such as Sn or Gd which are generated by a droplet generator 6. The laser beam 5 causes the droplets to be vaporized, thereby generating the plasma 2.

Radiation 7 emitted by the plasma 2 is collected by a collector 8, and is directed onto a grating spectral filter 10. The radiation 7 then passes from the grating spectral filter 10 to an intermediate focus 12. The intermediate focus 12 acts as a virtual source point at an aperture in the source SO. From source SO, the radiation 7 forms a beam of radiation 14 that is reflected in the illuminator IL via first and second normal incidence reflectors 16, 18 onto a patterning device (e.g. a mask) positioned on support structure MT. A patterned beam 20 is formed which is imaged in the projection system PS via first and second reflective elements 22, 24 onto a substrate (not shown) held on a substrate table WT. More elements than shown may generally be present in the illuminator IL and projection system PS.

Greater or fewer elements than shown in the FIG. 2 may generally be present in the illuminator IL and projection system PS. For example, there may be greater or fewer mirrors present than those shown in FIG. 2.

Figure 3:
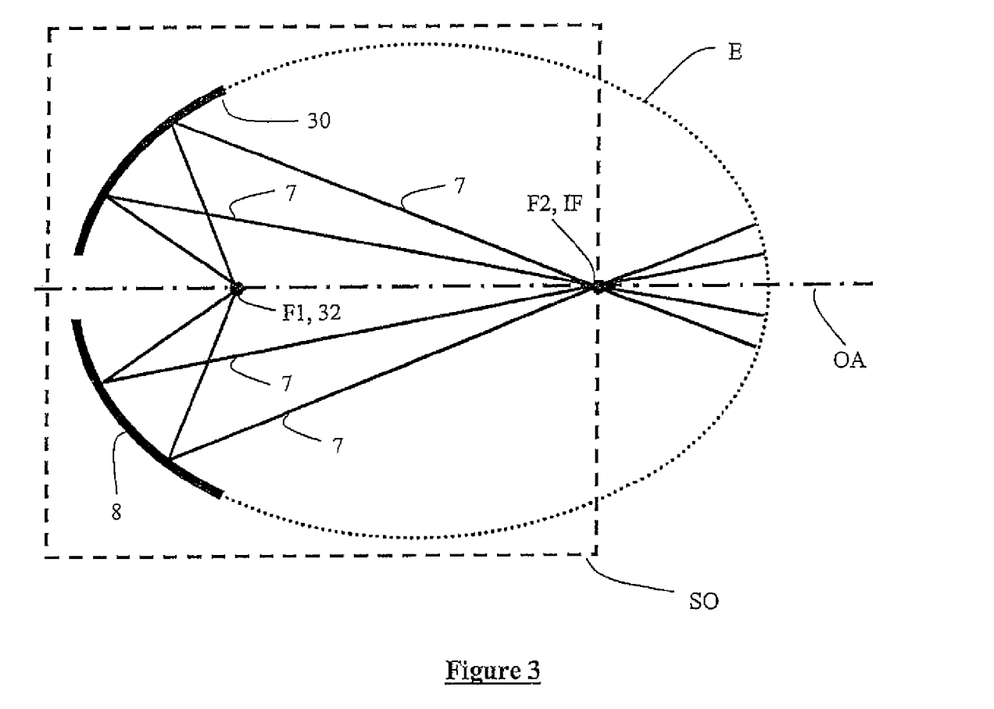
FIG. 3 schematically depicts an embodiment of a radiation source.

FIG. 3 shows an embodiment of a radiation source SO, in cross-section, including a normal incidence collector 8. The collector 8 has an elliptical configuration, having two natural ellipse focus points F1, F2. Particularly, the normal incidence collector includes a collector having a single radiation collecting surface 30 having the geometry of the section of an ellipsoid. The ellipsoid radiation collecting surface section 30 extends along a virtual ellipsoid (part of which is depicted by as dotted line E in the drawing).

As will be appreciated by the skilled person, because the collector mirror 8 is ellipsoidal (i.e., including a reflective radiation collecting surface 30 that extends along an ellipsoid), the collector mirror 8 focuses radiation from one focal point F1 into another focal point F2. The focal points are located on the long axis of the ellipsoid at a distance $f = (a^2 - b^2)^{1/2}$ from the center of the ellipse, where $2a$ and $2b$ are the lengths of the major and minor axes, respectively. The long axis of the ellipsoid defines an optical axis OA for the radiation source SO.

If the embodiment shown in FIG. 1 includes a laser produced plasma (LPP) radiation source SO, the collector 8 may be a single ellipsoidal mirror as shown in FIG. 3, where a plasma formation site 32 is positioned in one focal point (F1) and an intermediate focus IF is established at the other focal point (F2) of the mirror. Radiation 7 is shown as emanating from the plasma generated at the plasma formation site 32, located in the first focal point (F1), towards the reflective radiation collecting surface 30 and being reflected by that surface towards the second focus point F2. For example, according to an embodiment, a mentioned intermediate focus IF may be located between the collector and an illuminator (see FIG. 1 or FIG. 2) of the lithographic apparatus, or be located in the illuminator, if desired.

In the present embodiment, the source SO is an LPP source, that is associated with a laser source configured to generate a laser beam of coherent light, having a predetermined wavelength. A beam of radiation (e.g., light) from the laser is focused onto a fuel (the fuel for example being supplied by a fuel supplier such as a fuel or droplet generator, and for example including fuel droplets) to generate a plasma and radiation therefrom, in a laser produced plasma process. The resulting radiation may be EUV radiation, in this embodiment. In a non-limiting embodiment, the laser source may be a so-called $CO_2$ laser, and the fuel may be tin (Sn), or a different type of fuel, as will be appreciated by the skilled person.

The plasma formed at the plasma formation site 32 may be configured to emit diverging radiation, and the collector 8 may be arranged to reflect that diverging radiation to provide a converging radiation beam that converges towards the intermediate focus and along an optical axis of the source (as shown in FIG. 3).

Figure 4:
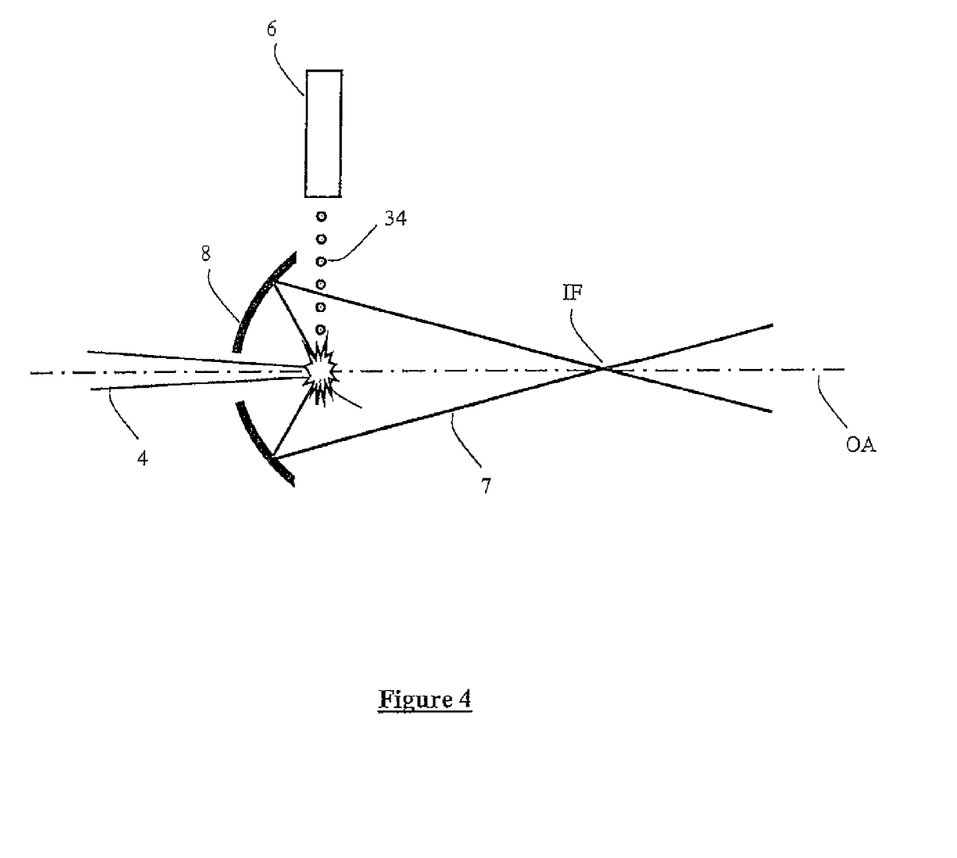
FIG. 4 schematically depicts an embodiment of a laser produced plasma (LPP) radiation source.

In an embodiment, the plasma is created by a pulsed high energy $CO_2$ laser source which shoots (i.e. is arranged to direct) a radiation beam onto a fuel target in the form of a droplet. FIG. 4 shows that droplets 34 may be formed by a (for example, tin) droplet generator 6. In an embodiment, a contamination barrier (not shown), which may also be called a debris mitigation system and may be in the form of a foil trap, may be present between the plasma formation site 32 and the collector 8. In the embodiment illustrated in FIG. 4, a droplet of fuel 34 may move out of focus of the laser beam 4 for faster droplet speeds and long laser pulses, such that not all available laser pulse energy can be used to convert the fuel droplet 34 into radiation. The droplet 34 and the laser beam pulse 4 are desirably synchronized in time so that the efficiency of the radiation source may be improved. It is desirable to have the position of the plasma very stable over time for optical reasons. For example, the positioning of the reflective surface of the collector 8, as well as other optical elements that are optically downstream of the source, may be more optimally positioned if the position of the plasma is stable over time, which may improve the efficiency of the radiation source and the lithographic apparatus. Advanced feedback loops may be desired, both for time synchronization and for position stability of the plasma (these feedback loops are desirably coupled). Even with control systems in place, light loss may occur for faster droplets and/or for longer laser pulses.

Figure 5:
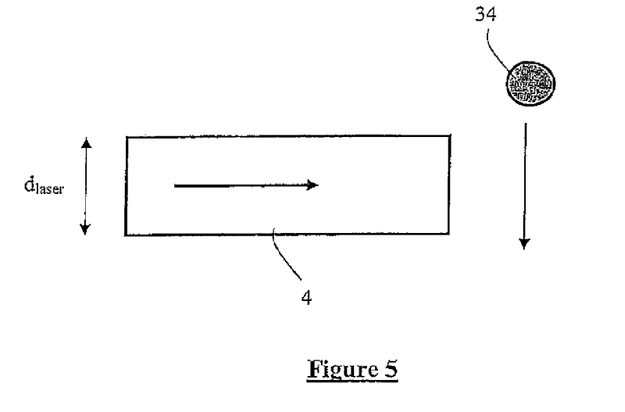
FIG. 5 schematically depicts operating principles associated with a laser produced plasma (LPP) radiation source.

FIG. 5 shows a laser beam pulse 4 and a fuel droplet 34. The droplet 34 is shown as moving toward the laser beam pulse 4 in a direction that is perpendicular to the direction of the laser beam pulse 4. The time that a plasma from the droplet 34 can be created is given by:

$$t_{plasma} = \frac{l_{droplet\text{-}laser}}{v_{droplet}} \quad \text{if } t_{laser\_pulse} > t_{plasma} \qquad (2)$$

Where $t_{plasma}$ is the time that the plasma can last, $l_{droplet\text{-}laser}$ is the path length of the droplet 34 through the laser beam pulse 4 (of sufficient intensity), $v_{droplet}$ is the speed of the droplet 34 and $t_{laser\_pulse}$ is the duration of the laser beam pulse 4.

Figure 6:
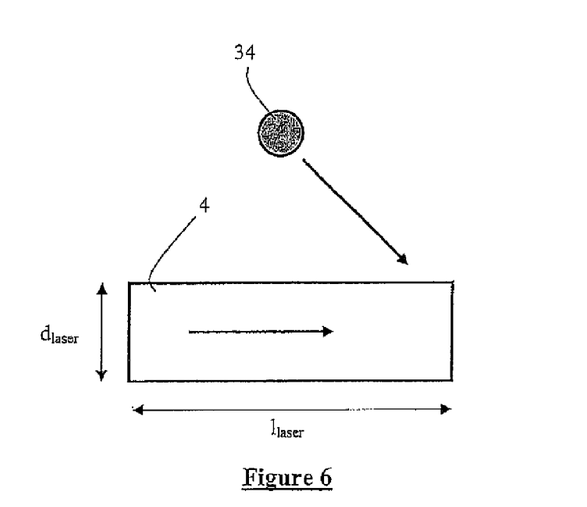
FIGS. 6 and 7 schematically depict operating principles associated with an embodiment of the present invention.

FIG. 6 shows that the laser beam pulse 4 can be approximated as a cylinder with a diameter $d_{laser}$ and an effective length in the direction of the laser beam pulse of $l_{laser}$. FIG. 6 also shows the droplet 34 moving toward the laser beam pulse 4 in a direction that is not perpendicular to the direction of the laser beam pulse 4. This may be advantageous, as discussed below.

Figure 7:
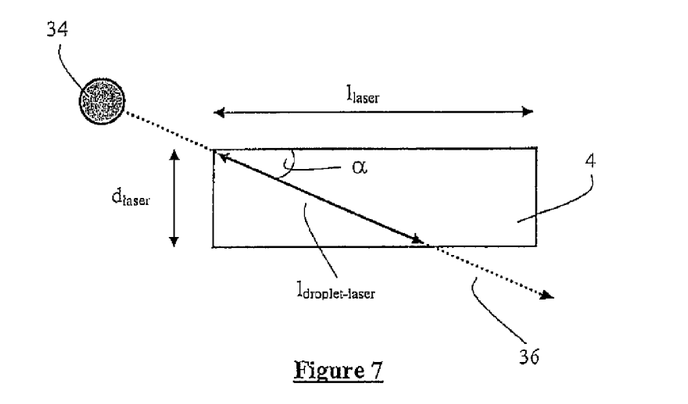

FIG. 7 again shows the droplet 34 moving toward the laser beam pulse 4 in a direction 36 that is not perpendicular to the direction of the laser beam pulse 4. Specifically, the Figure shows the droplet 34 moving toward the laser beam pulse 4 at an angle α with respect to the direction of the laser beam pulse 4. The path length $l_{droplet\text{-}laser}$ of the droplet 34 through the laser beam pulse 4 is then approximately:

$$l_{droplet\text{-}laser} = \frac{d_{laser}}{\sin\alpha}, \text{ as long as } l_{laser} > \frac{d_{laser}}{\tan\alpha} \quad (3)$$

Provided that the duration of the laser beam pulse 4 is long enough, better use can be made of laser beam pulse so as to increase the plasma lifetime and to increase the optical output of the radiation source. For example, when α is greater than or less than about 90°, it can be seen that the path length of the droplet 34 through the laser beam pulse 4 is greater in comparison with the situation shown in and described with reference to FIG. 5, where the droplet 34 is shown as moving toward the laser beam pulse 4 in a direction that is perpendicular to the direction of the laser beam pulse 4.

It will be understood that the path length of a droplet passing through the laser beam pulse may also be described as a collision length or distance, since the laser beam is colliding with the droplet over this path length. Similarly, it will be understood that the time taken for a droplet to pass through the laser beam pulse may also be described as a collision time, since the laser beam is colliding with the droplet over this time. An embodiment of the present invention may therefore be described as a droplet-laser beam collision time increasing apparatus, and/or as a method of increasing the collision time.

In an embodiment, the angle α is less than about 85°. In an embodiment, the angle α is less than about 80°. In an embodiment, the angle α is less than about 75°. In an embodiment, the angle α is less than about 70°. In an embodiment, the angle α is less than about 65°. In an embodiment, the angle α is less than about 60°. In an embodiment, the angle α is less than about 55°. In an embodiment, the angle α is less than about 50°. In an embodiment, the angle α is less than about 45°. In an embodiment, the angle α is less than about 40°. In an embodiment, the angle α is less than about 35°. In an embodiment, the angle α is less than about 30°. In an embodiment, the angle α is less than about 25°. In an embodiment, the angle α is less than about 20°. In an embodiment, the angle α is less than about 15°. In an embodiment, the angle α is less than about 10°. In an embodiment, the angle α is less than about 5°.

In accordance with an embodiment of the present invention, because the time taken for a droplet of the stream of droplets to pass through at least a part of the laser beam pulse is longer (i.e. the path length of the droplet through the laser beam pulse is longer), the total optical output of the radiation source may be higher, provided that the laser beam pulse lasts long enough. For example, the EUV output may be increased by a factor of or proportional to $1/(\sin\alpha)$. It will therefore be appreciated that the direction of the laser beam and/or the stream of droplets maybe controlled to control a property of radiation generated by the radiation source (e.g. the duration or intensity of the radiation).

Another potential advantage of embodiments of the present invention is that the synchronization between the timing of the laser beam pulse and the generation of droplets may become less demanding, since the droplet is in the laser beam pulse for a longer period of time.

As a result of embodiments of the present invention, the EUV emitting plasma volume (i.e., plasma formation site) may become larger. As long as the larger volume has no negative impact on the optical properties of a so-called optical column of the lithographic apparatus, this may relax the position stability specification, since the shadows in the far field may become less sharp. Less sharp shadows mean that small plasma position variations may lead to less intensity gradients on a far field mirror when the plasma position moves. Any shift in the position of the plasma position may become relatively smaller, since the plasma itself is larger.

Figure 8A:
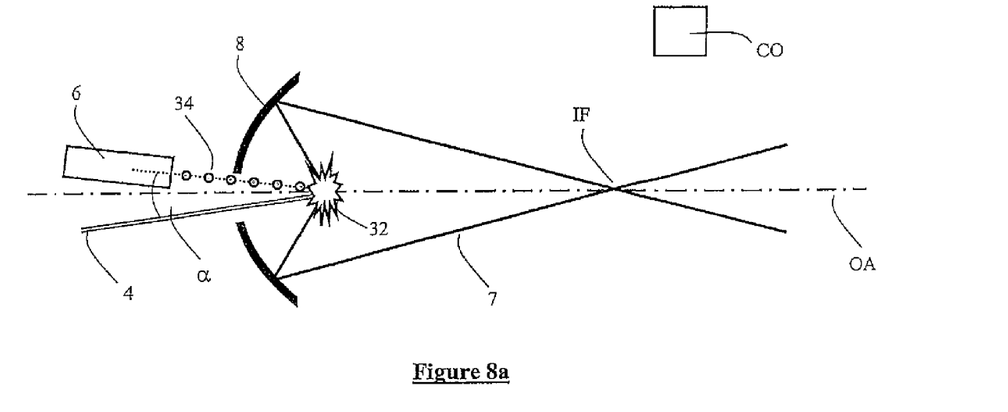
FIGS. 8a and 8b schematically depict radiation sources according to embodiments of the present invention.
Figure 8B:
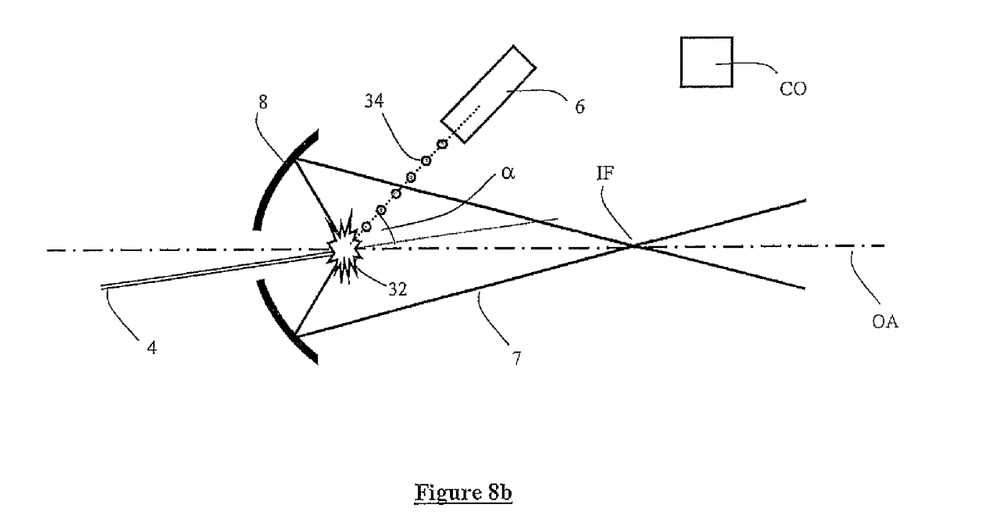

The laser (and thus the direction of the laser beam pulses) may be aligned with the optical axis of the source such that the beam of radiation provided by the laser is substantially in line with the optical axis of the source. However, the laser (and thus the direction of the laser beam pulses) does not need to be aligned with the optical axis of the source such that the beam of radiation provided by the laser is substantially in line with the optical axis of the source. The laser may direct laser beam pulses at any appropriate angle, and/or the droplet generator may direct droplets at any appropriate angle. FIGS. 8a and 8b show two such examples.

FIG. 8a shows that the droplets 34 and the laser beam pulses 4 may be directed through an aperture 38 provided in the collector 8. This arrangement may, for example, save space in and around the collector. In other embodiments, only one of the laser beam pulses and the droplets may be directed through such an aperture.

FIGS. 8a and 8b also show that, for example, a controller CO may be provided. The controller CO may be in communication with the droplet generator 6 and/or the laser that provides the laser beam pulses 4 to control the angles at which the droplets and laser beam pulse are directed. Alternatively, the controller CO may be in communication with arrangement which control the position or orientation of the droplet generator 6 and/or the laser that provides the laser beam pulses 4 to control the angles at which the droplets and laser beam pulse are directed. The controller CO may be used to control the angle α referred to above, in order to control the time taken for a droplet to pass through the laser beam pulse. The controller CO may thus be used to control a to control, for example, the amount of radiation that is generated by the radiation source. The controller may be a part of the radiation source. The controller may be a part of the lithographic apparatus, and be in communication with the droplet generator and/or laser. The controller may obtain or be provided with data at least indicative of a direction in which the droplets and/or laser beam is/are to be directed. The controller may, for example, be a computer or the like.

The droplets may be directed in a direction that is perpendicular to the optical axis of the radiation source. In another embodiment, the droplets may be directed in a direction that is not perpendicular to the optical axis of the radiation source. The laser beam pulse and/or the droplet may have a component of movement along the optical axis of the radiation source which is pointing away from the collector. This may reduce the amount of contamination that is incident on the collector during or after the formation of the plasma. This may alternatively and/or additionally increase the time during which the droplet may pass through the laser beam pulse.

In an embodiment, the laser may be a $CO_2$ laser. Other lasers may be used, as is known in the art. The laser may generate a continuous laser beam, and/or one or more laser beam pulses that make up the laser beam.

In order to ensure that the droplets are directed in a certain direction, the droplets may not be dropped. Instead, the droplets may be fired, projected or the like. The firing or projection may be such that the direction of movement of the droplets does not significantly change from the time of firing/projection until the time at which the laser beam pulse is incident on the droplet. Such constant and consistent direction may not always be possible, for example during the start-up time and shut-down time of the droplet generator. During these times, droplets may fall short of the plasma formation site. A catchment arrangement may thus be provided for catching droplets that are not directed at the desired angle (i.e. toward the plasma generation site) and which might otherwise contaminate one or more parts of the lithographic apparatus or radiation source. The catchment arrangement may be a receptacle or a gutter or the like.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation source configured to generate radiation, the radiation source comprising:
    a fuel droplet generator constructed and arranged to generate a stream of droplets of fuel that are directed to a plasma generation site;
    a laser constructed and arranged to generate a single laser beam that is directed to the plasma generation site;
    a controller configured to control the position or orientation of the fuel droplet generator and/or the laser to control the direction of the laser beam and/or the direction of movement of the stream of droplets to control an angle between the laser beam and the stream of droplets; and
    a collector constructed and arranged to collect radiation generated by a plasma formed at the plasma formation site when the beam of radiation and a droplet collide, the collector being configured to reflect the radiation substantially along an optical axis of the radiation source, wherein the laser beam is directed to the plasma generation site through an aperture provided in the collector.

2. The radiation source of claim 1, wherein the stream of droplets are directed such that the stream of droplets has a component of movement along the optical axis of the radiation source pointing away from the collector.

3. The radiation source of claim 1, wherein the laser beam and the stream of droplets are directed such that the laser beam and the stream of droplets have a component of movement along the optical axis of the radiation source pointing away from the collector.

4. The radiation. source of claim 1, wherein the angle between the direction of movement of the stream of droplets and the direction of the laser beam is less than 85 °.

5. The radiation source of claim 1, wherein the angle between the direction of movement of the stream of droplets and the direction of the laser beam is less than 45 °.

6. The radiation source of claim 1, wherein the stream of droplets are directed to the plasma generation site through an aperture provided in the collector.

7. The radiation source of claim 1, wherein the radiation source is configured to generate EUV radiation.

8. The radiation source of claim 1, wherein the angle between the direction of movement of the stream of droplets and the direction of the laser beam is less than 90°.

9. A method of generating radiation, comprising:
    directing a stream of droplets of fuel from a fuel droplet generator to a plasma generation site;
    directing a laser beam generated by a single laser to the plasma generation site;
    controlling the position or orientation of the fuel droplet generator and/or the laser to control the direction of the laser beam and/or the direction of movement of the stream of droplets to control an angle between the laser beam and the stream of droplets;
    collecting radiation generated by a plasma formed at the plasma formation site when the beam of radiation and a droplet collide with a collector; and
    reflecting the radiation substantially along an optical axis of the radiation source,
    wherein the laser beam and/or the stream of droplets are directed to the plasma generation site through an aperture provided in the collector.

10. A radiation source configured to generate radiation, the radiation source comprising:
    a fuel droplet generator constructed and arranged to generate a stream of droplets of fuel that are directed to a plasma generation site;
    a laser constructed and arranged to generate a single laser beam that is directed to the plasma generation site; and
    a controller configured to control the position or orientation of the fuel droplet generator and/or the laser to control the direction of the laser beam and/or the direction of movement of the stream of droplets to control an angle between the laser beam and the stream of droplets.

11. The radiation source of claim 10, wherein the direction of the laser beam and/or the stream of droplets is controlled to control the time taken for a droplet of the stream of droplets to pass through at least a part of the laser beam.

12. The radiation source of claim 10, wherein an angle between the stream of droplets and the direction of the laser beam is less than 90°.

13. The radiation source of claim 10, wherein the stream of droplets are directed to the plasma generation site through an aperture provided in the collector.

14. A method of generating radiation, the method comprising:
    directing a stream of droplets of fuel from a fuel droplet generator to a plasma generation site;
    directing a laser beam generated by a single laser to the plasma generation site; and
    controlling the position or orientation of the fuel droplet generator and/or the laser to control the direction of the laser beam and/or the direction of movement of the stream of droplets to control an angle between the laser beam and the stream of droplets.

15. A fuel droplet-laser beam collision time increasing apparatus arranged to generate radiation, the apparatus comprising:
a fuel droplet generator constructed and arranged to generate a stream of droplets of fuel that are directed to a plasma generation site;
a laser constructed and arranged to generate a single laser beam that is directed to the plasma generation site, an angle between the direction of movement of the stream of droplets and the direction of the laser beam being less than about 90°; and
a controller constructed and arranged to control the position or orientation of the fuel droplet generator and/or the laser to control the angle between the direction of movement of the stream of droplets and the direction of the laser beam.

16. A method of increasing the collision time between a droplet of fuel and at least a part of a laser beam, the collision resulting in the generation of radiation, the method comprising:
directing a stream of droplets of fuel from a fuel droplet generator to a plasma generation site;
directing a laser beam generated by a single laser to the plasma generation site, an angle between the stream of droplets and the direction of the laser beam being less than about 90°; and
controlling the position or orientation of the fuel droplet generator and/or the laser to control the angle between the direction of movement of the stream of droplets and the direction of the laser beam.

17. A lithographic apparatus comprising:
a radiation source configured to generate radiation, the radiation source comprising
a fuel droplet generator constructed and arranged to generate a stream of droplets of fuel that are directed to a plasma generation site,
a laser constructed and arranged to generate a single laser beam that is directed to the plasma generation site,
a controller configured to control the position or orientation of the fuel droplet generator and/or the laser to control the direction of the laser beam and/or the direction of movement of the stream of droplets to control an angle between the laser beam and the stream of droplets, and
a collector constructed and arranged to collect radiation generated by a plasma formed at the plasma formation site when the beam of radiation and a droplet collide, the collector being configured to reflect the radiation substantially along an optical axis of the radiation source to an intermediate focus,
wherein the laser beam is directed to the plasma generation site through an aperture provided in the collector;
a support constructed and arranged to support a patterning device, the patterning device being configured to pattern radiation that passes through the intermediate focus; and
a projection system constructed and arranged to project the patterned radiation onto a substrate.

18. A lithographic apparatus comprising:
a radiation source configured to generate radiation, the radiation source comprising:
a fuel droplet generator constructed and arranged to generate a stream of droplets of fuel that are directed to a plasma generation site;
a laser constructed and arranged to generate a single laser beam that is directed to the plasma generation site; and
a controller configured to control the position or orientation of the fuel droplet generator and/or the laser to control the direction of the laser beam and/or the direction of movement of the stream of droplets to control the angle between the laser beam and the stream of droplets;
a support constructed and arranged to support a patterning device, the patterning device being configured to pattern radiation that passes from the radiation source and through an intermediate focus; and
a projection system constructed and arranged to project the patterned radiation onto a substrate.

19. A lithographic apparatus comprising:
a fuel droplet-laser beam collision time increasing apparatus arranged to generate radiation, the fuel droplet-laser beam collision time increasing apparatus comprising
a fuel droplet generator constructed and arranged to generate a stream of droplets of fuel that are directed to a plasma generation site,
a laser constructed and arranged to generate a single laser beam that is directed to the plasma generation site, an angle between the direction of movement of the stream of droplets and the direction of the laser beam being less than about 90°, and
a controller constructed and arranged to control the position or orientation of the fuel droplet generator and/or the laser to control the angle between the direction of movement of the stream of droplets and the direction of the laser beam;
a support constructed and arranged to support a patterning device, the patterning device being configured to pattern radiation that passes from the fuel droplet-laser beam collision time increasing apparatus and through an intermediate focus; and
a projection system constructed and arranged to project the patterned radiation onto a substrate.

20. A device manufacturing method comprising:
generating radiation, said generating radiation comprising
directing a stream of droplets of fuel from a fuel droplet generator to a plasma generation site,
directing a laser beam generated by a single laser to the plasma generation site,
controlling the position or orientation of the fuel droplet generator and/or the laser to control the angle between the direction of movement of the stream of droplets and the direction of the laser beam,
collecting radiation generated by a plasma formed at the plasma formation site when the beam of radiation and a droplet collide with a collector, and
reflecting the radiation substantially along an optical axis of the radiation source,
wherein the laser beam and/or the stream of droplets are directed to the plasma generation site through an aperture provided in the collector;
patterning the radiation with a patterning device; and
projecting the patterned radiation onto a substrate.

21. A device manufacturing method comprising:
generating radiation, said generating radiation comprising
directing a stream of droplets of fuel from a fuel droplet generator to a plasma generation site,
directing a laser beam generated by a single laser to the plasma generation site, and
controlling the position or orientation of the fuel droplet generator and/or the laser to control the direction of the laser beam and/or the direction of movement of the stream of droplets to control an angle between the laser beam and the stream of droplets;

patterning the radiation with a pattering device; and projecting the patterned radiation onto a substrate.

22. A device manufacturing method comprising:

generating radiation by increasing the collision time between a droplet of fuel and at least a part of a laser beam, said increasing the collision time comprising directing a stream of droplets of fuel from a fuel droplet generator to a plasma generation site, directing a laser beam generated by a single laser to the plasma generation site, an angle between the stream of droplets and the direction of the laser beam being less than about 90°, and controlling the position or orientation of the fuel droplet generator and/or the laser to control the angle, between the direction of movement of the stream of droplets and the direction of the laser beam;

patterning the radiation with a patterning device; and projecting the patterned radiation onto a substrate.

* * * * *